United States Patent [19]
Grumbine et al.

[11] Patent Number: 5,980,775
[45] Date of Patent: Nov. 9, 1999

[54] COMPOSITION AND SLURRY USEFUL FOR METAL CMP

[75] Inventors: Steven K. Grumbine; Christopher C. Streinz; Brian L. Mueller, all of Aurora, Ill.

[73] Assignee: Cabot Corporation, Boston, Mass.

[21] Appl. No.: 08/827,918

[22] Filed: Apr. 8, 1997

Related U.S. Application Data

[63] Continuation-in-part of application No. 08/753,482, Nov. 26, 1996.

[51] Int. Cl.$^6$ .................................................. C09K 13/00
[52] U.S. Cl. ...................... 252/79.1; 438/692; 438/693; 216/89; 106/3; 51/308; 51/309
[58] Field of Search ..................... 438/692, 693; 252/79.1; 216/89

[56] References Cited

U.S. PATENT DOCUMENTS

| | | | |
|---|---|---|---|
| 3,877,936 | 4/1975 | Shinozaki et al. | 96/29 L |
| 3,877,938 | 4/1975 | Shinozaki et al. | |
| 4,671,851 | 6/1987 | Beyer et al. | 156/645 |
| 4,789,648 | 12/1988 | Chow et al. | 437/225 |
| 4,885,106 | 12/1989 | Lapham et al. | 252/100 |
| 4,910,155 | 3/1990 | Cote et al. | 437/8 |
| 4,929,257 | 5/1990 | Roberts. | |
| 4,944,836 | 7/1990 | Beyer et al. | 156/645 |
| 4,956,313 | 9/1990 | Cote et al. | 437/203 |
| 4,992,135 | 2/1991 | Doan | 156/636 |
| 5,114,437 | 5/1992 | Takeushi. | |
| 5,137,544 | 8/1992 | Medellin | 51/308 |
| 5,157,876 | 10/1992 | Medellin | 57/281 R |
| 5,209,816 | 5/1993 | Yu et al. | 156/636 |
| 5,225,034 | 7/1993 | Yu et al. | |
| 5,226,955 | 7/1993 | Owaki. | |
| 5,244,534 | 9/1993 | Yu et al. | 156/636 |
| 5,340,370 | 8/1994 | Cadien et al. | 156/636 |
| 5,354,490 | 10/1994 | Yu et al. | 252/79.1 |
| 5,391,258 | 2/1995 | Brancaleoni et al. | 156/636 |
| 5,476,606 | 12/1995 | Brancaleoni et al. | 106/1.05 |
| 5,527,423 | 6/1996 | Neville et al. | 156/636 |
| 5,575,837 | 11/1996 | Kodama et al. | 106/3 |

FOREIGN PATENT DOCUMENTS

| | | |
|---|---|---|
| 0 401 147 | 12/1990 | European Pat. Off. . |
| 0 708 160 | 4/1996 | European Pat. Off. . |
| 2 247 892 | 3/1992 | United Kingdom . |
| WO 95 24054 | 9/1995 | WIPO . |
| WO 96 16436 | 5/1996 | WIPO . |

OTHER PUBLICATIONS

Cabot Corporation Semi–Sperse™ W–A355 Polishing Slurry for Tungsten CMP product literature.
Cabot Corporation Semi–Sperse™ FE–10 Oxidizer Solution for Tungsten CMP product literature.
Cabot Corporation General Information on Semi–Sperse™ W–A355 Polishing Slurry for Tungsten CMP product literature.
DuPont Oxone® Monopersulfate Compound, oxone Monopersulfate Compound, pp. 1–6 (1994).
Analysis of MSW1000 Slurry (Oct. 27, 1995).
Patent Abstracts of Japan, publication number 6342782, publication date Nov. 11, 1988.

*Primary Examiner*—Bruce Breneman
*Assistant Examiner*—Shamim Ahmed

[57] ABSTRACT

A chemical mechanical polishing composition comprising an oxidizing agent at least one catalyst having multiple oxidation states, and at least one stabilizer, the composition being useful when combined with an abrasive or with an abrasive pad to remove metal layers from a substrate.

26 Claims, No Drawings

COMPOSITION AND SLURRY USEFUL FOR METAL CMP

BACKGROUND OF THE INVENTION

This application is a continuation-in-part of co-pending U.S. patent application Ser. No. 08/753,482, filed on Nov. 26, 1996.

FIELD OF THE INVENTION

This invention concerns a chemical mechanical polishing slurry including at least one oxidizer and a catalyst. The chemical mechanical polishing slurry is useful alone or in combination with other chemicals and abrasives for polishing metal layers and thin-films associated with semiconductor manufacturing. More particularly this invention concerns a chemical mechanical polishing slurry that is especially adapted for polishing multiple metal layers and thin-films where one of the layers or films is comprised of tungsten and another layer or thin film is comprised of titanium or a titanium containing alloy such as titanium nitride. This invention also concerns a chemical mechanical polishing composition including at least one oxidizer, at least one catalyst, and at least one stabilizer.

DESCRIPTION OF THE RELATED ART

Integrated circuits are made up of millions of active devices formed in or on a silicon substrate. The active devices, which are initially isolated from one another, are united to form functional circuits and components. The devices are interconnected through the use of well-known multilevel interconnections. Interconnection structures normally have a first layer of metallization, an interconnection layer, a second level of metallization, and sometimes a third and subsequent levels of metallization. Interlevel dielectrics such as doped and undoped silicon dioxide ($SiO_2$), are used to electrically isolate the different levels of metallization in a silicon substrate or well. The electrical connections between different interconnection levels are made through the use of metallized vias. U.S. Pat. No. 4,789,648, which is incorporated herein by reference, describes a method for preparing multiple metallized layers and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to $SiO_2$. At the contact level, the adhesion layer acts as a diffusion barrier to prevent tungsten and $SiO_2$ from reacting.

In one semiconductor manufacturing process, metallized vias or contacts are formed by a blanket tungsten deposition followed by a chemical mechanical polish (CMP) step. In a typical process, via holes are etched through an interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess metal is removed by chemical mechanical polishing (CMP) to form metal vias. Processes for manufacturing and/or CMP of ILD's are disclosed in U.S. Pat. Nos. 4,671,851, 4,910,155 and 4,944,836.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry" is deposited onto the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed.

The slurry composition is an important factor in the CMP step. Depending on the choice of the oxidizing agent, the abrasive, and other useful additives, the polishing slurry can be tailored to provide effective polishing to metal layers at desired polishing rates while minimizing surface imperfections, defects, corrosion, and erosion. Furthermore, the polishing slurry may be used to provide controlled polishing selectivities to other thin-film materials used in current integrated circuit technology such as titanium, titanium nitride and the like.

Typically CMP polishing slurries contain an abrasive material, such as silica or alumina, suspended in an oxidizing, aqueous medium. For example, U.S. Pat. No. 5,244,534 to Yu et al. reports a slurry containing alumina, hydrogen peroxide, and either potassium or ammonium hydroxide that is useful to remove tungsten at predictable rates with little removal of the underlying insulating layer. U.S. Pat. No. 5,209,816 to Yu et al. discloses a slurry comprising perchloric acid, hydrogen peroxide and a solid abrasive material in an aqueous medium. U.S. Pat. No. 5,340,370 to Cadien and Feller discloses a tungsten polishing slurry comprising approximately 0.1M potassium ferricyanide, approximately 5 weight percent silica and potassium acetate. Acetic acid is added to buffer the pH at approximately 3.5.

Most of the currently available CMP slurries contain large concentrations of dissolved, ionic metallic components. As a result, the polished substrates can become contaminated by the adsorption of charged species into the interlayers. These species can migrate and change the electrical properties of the devices at gates and contacts and change the dielectric properties of the $SiO_2$ layers. These changes may reduce the reliability of the integrated circuits with time. Therefore, it is desirable to expose the wafer only to high purity chemicals with very low concentrations of mobile metallic ions.

Known, non-metallic oxidizers suffer from typically low tungsten polishing rates. Because it is difficult to polish the tungsten at a high rate, the polishing step must be lengthened to remove the last traces of the deposited tungsten layer. Lengthening the polishing step exposes layers, such as $SiO_2$, to overpolishing and to undesireable erosion. This erosion makes it more difficult to print high resolution lines during subsequent photolithography steps increasing the number of wafer failures. In addition, lengthened polishing steps reduce the throughput of an IC fabrication plant and increase the cost of the resulting IC.

A new CMP slurry is, therefore, required that is both essentially free of potential integrated circuit contaminants and that polishes at high rates. In addition, a new CMP slurry and composition is needed that remains stable and active long after the compositions and slurry is prepared.

SUMMARY OF THE INVENTION

The present invention is directed to a single chemical mechanical polishing composition that is essentially metal free in that it will generally include less than about 3000 ppm of metals or metal ions. Such a metal free chemical mechanical polishing composition will produce polished substrates with fewer defects that are generally attributed to the presence of metals and metal contaminants in CMP slurries.

In addition, the chemical mechanical polishing composition of this invention is able to polish tungsten, titanium, and titanium nitride layers at high rates.

This invention is also a chemical mechanical polishing composition that presents fewer disposal problems due to its very low metals content.

In addition, this invention is a state-of-the-art chemical mechanical polishing composition that is able to polish tungsten at very high rates with minimal impurity defects and that can be easily disposed of once used.

This invention is also a chemical mechanical polishing slurry and composition that has a long shelf life.

Furthermore, this invention is directed to methods for using the chemical mechanical polishing composition of this invention in a slurry to polish a plurality of metal layers in an integrated circuit.

In one embodiment, this invention is a chemical mechanical polishing composition comprising an oxidizing agent and at least one catalyst having multiple oxidation states.

In another embodiment, this invention is a chemical mechanical polishing slurry comprising an abrasive, ferric nitrate, and from about 1.0 to about 10.0 weight percent of an oxidizing agent selected from the group consisting of hydrogen peroxide and monopersulfate. When the oxidizing agent is hydrogen peroxide, then the slurry includes from about 0.01 to about 0.05 weight percent ferric nitrate. When the oxidizing agent is monopersulfate, then the slurry includes from 0.1 to about 0.5 weight percent ferric nitrate.

In another embodiment, this invention is a chemical mechanical composition including at least one oxidizing agent and the product of the mixture of at least one catalyst having multiple oxidation states and at least one stabilizer. The composition is most useful in CMP methods for polishing substrates comprising tungsten.

In still another embodiment, this invention is a method for polishing a substrate, including at least one metal layer, comprising the steps of preparing CMP slurry by admixing at least one abrasive, at least one oxidizing agent, at least one catalyst having multiple oxidation states and deionized water. Next, the CMP slurry is applied to the substrate, and at least a portion of the metal layer is removed from the substrate by bringing a pad into contact with the substrate.

In yet another embodiment, this invention is a method for polishing a substrate including a tungsten layer. The method is accomplished by preparing a CMP slurry by admixing from about 1.0 to about 15.0 weight percent silica, from about 0.01 to about 1.0 weight percent ferric nitrate, from about 0.50 to about 10.0 weight percent of an oxidizing agent selected from the group consisting of hydrogen peroxide, monopersulfates and mixtures thereof, and deionized water. Next, the chemical mechanical polishing slurry is applied to the substrate, and at least a portion of the tungsten layer is removed from the substrate by bringing a pad into contact with the substrate and moving the pad in relation to the substrate.

In another embodiment, this invention is a multi-package system useful for preparing a chemical mechanical polishing slurry. The multiple package system includes a first container comprising at least one oxidizing agent and a second container comprising at least one catalyst having multiple oxidation states.

DESCRIPTION OF THE CURRENT EMBODIMENT

The present invention relates to a chemical mechanical polishing composition that comprises at least one oxidizer and at least one catalyst that promotes a chemical reaction between the oxidizer and a substrate metal layer. The chemical mechanical polishing composition is used to polish at least one metal layer associated with a substrate selected from the group including silicon substrates, TFT-LCD glass substrates, GaAs substrates, and other substrates associated with integrated circuits, thin films, multiple level semiconductors, and wafers. In particular, the chemical mechanical polishing slurry of this invention has been found to exhibit excellent polishing performance when used to polish a substrate including one or more layers of tungsten, titanium, and titanium nitride in a single step, multiple metal layer chemical mechanical polishing process.

Before describing the details of the various preferred embodiments of this invention, some of the terms that are used herein will be defined. The "chemical mechanical composition" refers to the combination comprising of at least one oxidizer and at least one catalyst that may be used in conjunction with an abrasive pad to remove one or more layers of metal from a multiple layer metallization.

The term chemical mechanical polishing slurry, ("CMP slurry"), refers to another useful product of this invention that comprises the chemical mechanical composition of this invention and at least one abrasive. The CMP slurry is useful for polishing a multiple level metallization which may include but are not limited to semi-conductor thin-films, integrated circuit thin-films, and for polishing any other films, surfaces and substrates where CMP processes are useful.

One aspect of this invention is a chemical mechanical composition comprising an oxidizing agent and catalyst that is useful in oxidizing metal layers in polishing applications. This chemical mechanical composition is useful when incorporated in a chemical mechanical polishing slurry to oxidize a metal layer to its corresponding oxide or ions. For example, the combination can be used to oxidize tungsten to tungsten oxide, aluminum to aluminum oxide and copper to copper oxide. The oxidizing agent—catalyst combinations disclosed herein are useful when incorporated into a CMP slurry or when used alone in conjunction with an abrasive pad to polish metals and metal based components including tungsten, titanium, titanium nitride, copper, aluminum and various mixtures and combinations thereof.

The chemical mechanical composition of this invention includes at least one oxidizing agent that has an electrochemical potential greater than the electrochemical potential necessary to oxidize the catalyst. For example an oxidizing agent having a potential of greater than 0.771 volts versus normal hydrogen electrode is necessary when a hexa aqua iron catalyst is oxidized from FE(II) to Fe(III). If an aqua copper complex is used, an oxidizing agent having a potential of greater than 0.153 volts versus normal hydrogen electrode is necessary to oxidize Cu(I) to CU(II). These potentials are for specific complexes only, and may change, as will the useful oxidizers, upon the addition of additives such as ligands (complexing agents) to the compositions of this invention.

The oxidizing agent is preferably an inorganic or organic per-compound. A per-compound as defined by Hawley's

*Condensed Chemical Dictionary* is a compound containing at least one peroxy group (-O—O-) or a compound containing, an element in its highest oxidation state. Examples of compounds containing at least one peroxy group include but are not limited to hydrogen peroxide and its adducts such as urea hydrogen peroxide and percarbonates, organic peroxides such as benzoyl peroxide, peracetic acid, and di-t-butyl peroxide, monopersulfates ($SO_5^-$), dipersulfates ($S_2O_8^-$), and sodium peroxide. Examples of compounds containing an element in its highest oxidation state include but are not limited to periodic acid, periodate salts, perbromic acid, perbromate salts, perchloric acid, perchloric salts, perboric acid, and perborate salts and permanganates. Examples of non-per compounds that meet the electrochemical potential requirements include but are not limited to bromates, chlorates, chromates, iodates, iodic acid, and cerium (IV) compounds such as ammonium cerium nitrate.

The most preferred oxidizing agents are hydrogen peroxide and its adducts, and monopersulfates. Monopersulfates are compounds which include the oxidizing $SO_5^-$ group as shown below.

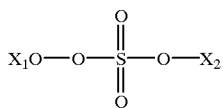

where $X_1$, and $X_2$ are each individually $H_1$, $Si(R')_3$, $NH_4$, $N(R'')_4$ and alkali earth metals such as Li, Na, K, and so forth; where R' is an alkyl group having from 1 to 10 or more carbon atoms, and wherein R" is H, an alkyl group, an aryl group, or mixtures thereof including, for example, $NMe_4$, $NBu_4$, $NPh_4$, $NMeBu_3$, $NHEt_3$ and so forth. One well known and preferred class of monopersulfates are combinations of $KHSO_5$, $KHSO_4$ and $K_2SO_4$. This combination is known as a triple salt.

The oxidizing agent may be present in the overall chemical mechanical polishing slurry in an amount ranging from about 0.5 to about 50.0 weight percent. It is preferred that the oxidizer is present in the slurry in an amount ranging from about 0.5 to about 10.0 weight percent.

The chemical mechanical composition of this invention includes at least one catalyst. The purpose of the catalyst is to transfer electrons from the metal being oxidized to the oxidizer (or analogously to transfer electrochemical current from the oxidizer to the metal). The catalyst or catalysts chosen may be metallic, non-metallic, or a combination thereof and the catalyst must be able to shuffle electrons efficiently and rapidly between the oxidizer and metal substrate surface. Preferably, the catalyst is chosen from metal compounds that have multiple oxidation states, such as but not limited to Ag, Co, Cr, Cu, Fe, Mo, Mn, Nb, Ni, Os, Pd, Ru, Sn, Ti and V. The term "multiple oxidation states" refers to an atom and/or compound that has a valence number that is capable of being augmented as the result of a loss of one or more negative charges in the form of electrons. Most preferred metal catalysts are compounds of Ag, Cu and Fe and mixtures thereof. Especially preferred are iron catalysts such as but not limited to inorganic salts of iron, such as iron (II or III) nitrate, iron (II or III) sulfate, iron (II or III) halides, including fluorides, chlorides, bromides, and iodides, as well as perchlorates, perbromates and periodates, and ferric organic iron (II or III) compounds such as but not limited to acetates, acetylacetonates, citrates, gluconates, oxalates, phthalates, and succinates, and mixtures thereof.

The catalyst may be present in the chemical mechanical polishing composition in an amount ranging from about 0.001 to about 2.0 weight percent. It is preferred that the catalyst will be present in the chemical mechanical polishing composition in an amount ranging from about 0.005 to about 0.5 weight percent. It is most preferred that the catalyst will be present in the composition in an amount ranging from about 0.01 to about 0.05 weight percent. At this preferred catalyst loading level, i.e., 0.05 weight percent or less, and when a non-metallic oxidizing agent such as hydrogen peroxide, urea hydrogen peroxide or monopersulfate is used, the chemical mechanical polishing composition is essentially metal and "metallic ion free" in comparison to commercially available ferric nitrate based slurries.

The amount of catalyst in the chemical mechanical composition of this invention may be varied depending upon the oxidizing agent used. When the preferred oxidizing agent hydrogen peroxide is used in combination with a preferred catalyst such as ferric nitrate, the catalyst will preferably be present in the composition in an amount ranging from about 0.005 to about 0.20 weight percent (approximately 7 to 280 ppm Fe in solution). When the preferred oxidizing agent is a triple salt of monopersulfate and a preferred catalyst such as ferric nitrate is used, the catalyst will preferably be present in the composition in an amount ranging from about 0.05 to about 1.0 weight percent (approximately 70 to about 1400 ppm Fe in solution).

The concentration ranges of catalyst in the chemical mechanical polishing slurry of this invention are generally reported as a weight percent of the entire compound. The use of high molecular weight metal containing compounds that comprise only a small percentage by weight of catalyst is well within the scope of catalysts in this invention. The term catalyst when used herein also encompasses compounds wherein the catalytic metal comprises less than 10% by weight of the metal in the composition and wherein the metal catalyst concentration in the CMP slurry is from about 2 to about 3000 ppm of the overall slurry weight.

The chemical mechanical composition of this invention may be combined with at least one abrasive to produce a CMP slurry. The abrasive is typically a metal oxide abrasive. The metal oxide abrasive may be selected from the group including alumina, titania, zirconia, germania, silica, ceria and mixtures thereof. The CMP slurry of this invention preferably includes from about 1.0 to about 20.0 weight percent or more of an abrasive. It is more preferred, however, that the CMP slurry of this invention includes from about 3.0 to about 7.0 weight percent abrasive.

The metal oxide abrasive may be produced by any techniques known to those skilled in the art. Metal oxide abrasives can be produced using any high temperature process such as sol-gel, hydrothermal or, plasma process, or by processes for manufacturing fumed or precipitated metal oxides. Preferably, the metal oxide is a fumed or precipitated abrasive and, more preferably it is a fumed abrasive such as fumed silica or fumed alumina. For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable and often considered irreversible. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art.

A preferred metal oxide will have a surface area, as calculated from the method of S. Brunauer, P. H. Emmet, and I. Teller, J. Am. Chemical Society, Volume 60, Page 309 (1938) and commonly referred to as BET, ranging from about 5 $m^2/g$ to about 430 $m^2/g$ and preferably from about 30 $m^2/g$ to about 170 $m^2/g$. Due to stringent purity requirements in the IC industry the preferred metal oxide should be of a high purity. High purity means that the total impurity content, from sources such as raw material impurities and trace processing contaminants, is typically less than 1% and preferably less than 0.01% (i.e., 100 ppm).

In this preferred embodiment, the metal oxide abrasive consists of metal oxide aggregates having a size distribution less than about 1.0 micron, a mean aggregate diameter less than about 0.4 micron and a force sufficient to repel and overcome the van der Waals forces between abrasive aggregates themselves. Such metal oxide abrasive has been found to be effective in minimizing or avoiding scratching, pit marks, divots and other surface imperfections during polishing. The aggregate size distribution in the present invention may be determined utilizing known techniques such as transmission electron microscopy (TEM). The mean aggregate diameter refers to the average equivalent spherical diameter when using TEM image analysis, i.e., based on the cross-sectional area of the aggregate. By force is meant that either the surface potential or the hydration force of the metal oxide particles must be sufficient to repel an overcome the van der Walls attractive forces between the particles.

In another preferred embodiment, the metal oxide abrasive may consist of discrete, individual metal oxide particles having a primary particle diameter less than 0.4 micron (400 nm) and a surface area ranging from about 10 $m^2/g$ to about 250 $m^2/g$.

It is preferred that the metal oxide abrasive is silica having a surface area of from about 120 $m^2/g$ to about 200 $m^2/g$.

Preferably, the metal oxide abrasive is incorporated into the aqueous medium of the polishing slurry as a concentrated aqueous dispersion of metal oxides, which concentrated aqueous dispersion of metal oxide abrasives typically ranges from about 3% to about 45% solids, and preferably between 10% and 20% solids. The aqueous dispersion of metal oxides may be produced utilizing conventional techniques, such as slowly adding the metal oxide abrasive to an appropriate media, for example, deionized water, to form a colloidal dispersion. The dispersion is typically completed by subjecting it to high shear mixing conditions known to those skilled in the art. The pH of the slurry may be adjusted away from the isoelectric point to maximize colloidal stability.

Other well known polishing slurry additives may be incorporated alone or in combination into the chemical mechanical polishing slurry of this invention. A non-inclusive list is inorganic acids, organic acids, surfactants, alkyl ammonium salts or hydroxides, and dispersing agents.

An additive which may be useful with this invention is one which stabilizes the oxidizer in the presence of the metal complex. It is well known that hydrogen peroxide is not stable in the presence of many metal ions without the use of stabilizers. For this reason, the CMP composition and slurries of this invention may include a stabilizer. Without the stabilizer, the catalyst and the oxidizing agent may react in a manner that degrades the oxidizing agent rapidly over time. The addition of a stabilizer to compositions of this invention reduces the effectiveness of the catalyst. Therefore the choice of the type and amount of stabilizer added to the composition is important and has a significant impact on CMP performance.

The addition of a stabilizer to the compositions and slurries of this invention is presently understood to create a stabilizer/catalyst complex that inhibits the catalyst from reacting with the oxidizing agent. For purpose of this disclosure the term "product of the mixture of at least one catalyst having multiple oxidation states and at least one stabilizer" refers to an admixture of both ingredients as used in a composition and slurry whether or not the combination of ingredients forms a complex in the end product.

Useful stabilizers include phosphoric acid, organic acids (e.g., adipic, citric, malonic, orthophthalic, and EDTA), phosphonate compounds, nitriles, and other ligands which bind to the metal and reduce its reactivity toward hydrogen peroxide decomposition and mixture thereof. The acid stabilizers may be used in their conjugate form, e.g., the carboxylate can be used instead of the carboxylic acid. For purposes of this application the term "acid" as it is used to describe useful stabilizers also means the conjugate base of the acid stabilizer. For example the term "adipic acid" means adipic acid and its conjugate base. Stabilizers can be used alone or in combination and significantly decrease the rate at which oxidizing agents such as hydrogen peroxide decomposes.

Preferred stabilizers include phosphoric acid, phthalic acid, citric acid, adipic acid, oxalic acid, malonic acid, benzonitrile and mixtures thereof. The preferred stabilizers will be added to the compositions and slurries of this invention in an amount ranging from about 1 equivalent per catalyst to about 3.0 weight percent or more. As used herein, the term "equivalent per catalyst" means one molecule of stabilizer per catalyst ion in the composition. For example 2 equivalents per catalyst means two molecules of stabilizer for each catalyst ion.

Most preferred stabilizers include from about 2 equivalents per catalyst to about 15 equivalents per catalyst of malonic acid, from about 3 equivalents per catalyst to about 3.0 weight percent phthalic acid, and the combination of from about 0 equivalents per catalyst to about 3 equivalents per catalyst oxalic acid and from about 0.2 to about 1.0 weight percent adipic acid.

The chemical mechanical polishing composition of this invention has been found to have a high tungsten (W) polishing rate as well as good polishing rates towards titanium (Ti). In addition, the chemical mechanical polishing composition exhibits desirable low polishing rates towards the dielectric insulating layer.

The composition of this invention may be produced using any techniques known to those skilled in the art. In one method, the oxidizing agent and catalyst are mixed into the aqueous medium, such as deionized or distilled water, at pre-determined concentrations under low shear conditions until such components are completely dissolved in the medium. A concentrated dispersion of the metal oxide abrasive, such as fumed silica, is added to the medium and diluted to the desired loading level of abrasive in the final CMP slurry. In addition, the catalyst and additive such as one or more stabilizers, may be added to the slurry by any method that is able to incorporate metal catalytic compounds of this invention in an aqueous solution.

In another method, the stabilizer and catalyst are admixed to form a complex prior to combining the complex with an oxidizing agent such as hydrogen peroxide. This may be accomplished by admixing the stabilizer and a metal oxide abrasive dispersion to give an abrasive/stabilizer dispersion followed by admixing the catalyst with the abrasive/stabilizer dispersion to give a catalyst/stabilizer complex in a metal oxide dispersion. The oxidizing agent is then added to the admixture. When the metal oxide abrasive is alumina, then the stabilizer and catalyst should be admixed to form a complex prior to admixing the complex with the alumina abrasive, otherwise the catalyst may be rendered ineffective.

The compositions of the present invention may be supplied as one package system (at least one oxidizing agent, at least one catalyst, optional abrasive, and optional additives in a stable aqueous medium). To avoid possible composition degradation, however, it is preferred that at least a two package system is used where the first package comprises at least one oxidizing agent, and the second package comprises at least one catalyst. Optional components, such as an abrasive and any optional additives may be placed in either the first container, the second container or in a third container. Furthermore, the components in the first container or second container may be in dry form while the components in the corresponding container are in the form of an aqueous dispersion. For example, the first container may comprise an oxidizer, such as hydrogen peroxide, in liquid form while the second container comprises a catalyst, such a ferric nitrate, in dry form. Alternately, the first container may comprise a dry oxidizing agent while the second container may comprise an aqueous solution of at least one catalyst. Other two-container, and three or more container combinations of the ingredients of the chemical mechanical composition and CMP slurry of this invention are within the knowledge of one of ordinary skill in the art.

A multi-package chemical mechanical composition or CMP slurry may be used with any standard polishing equipment appropriate for use on the desired metal layer of the wafer. The multi-package system includes one or more CMP components in aqueous or dry form in two or more containers. The multi-package system is used by combining the components from the various containers in the desired amounts to give a CMP slurry comprising at least one oxidizing agent, at least one catalyst, and an optional abrasive in amounts described above.

EXAMPLES

We have discovered that a composition including an oxidizer and a catalyst is capable of polishing a multiple metal layer comprising tungsten and titanium at high rates while exhibiting an acceptable low polishing rate towards the dielectric layer.

The following examples illustrate preferred embodiments of this invention as well as preferred methods for using compositions of this invention.

EXAMPLE 1

Polishing slurries were prepared in order to evaluate the performance of the resulting CMP slurries on tungsten wafer CMP. Performance parameters measured included tungsten polishing rates. A standard abrasive slurry including 5.0 weight percent colloidal silica and deionized water was used for all runs. Various oxidizing agents and catalysts were added to the standard abrasive slurry in order to evaluate the effect of various CMP slurry compositions on tungsten polishing rates. The polishing slurries were prepared by combining appropriate amounts of SCE fumed silica-based dispersion manufactured by Cabot Corporation and sold under the trademark CAB-O-SPERSE® with the recited amounts of oxidizing agent, catalyst, and, if appropriate, additional additives.

The CMP slurries were applied to chemically-mechanically polish tungsten blanket wafers having thickness of approximately 8000 Å using a SUBA 500/SUBA IV pad stack manufactured by Rodel, Inc. The polishing was performed using a IPEC/WESTECH 472 CMP tool for one minute at a down force of 5 psi, a slurry flow rate of 150 ml/min, a table speed of 60 rpm, and a spindle speed of 65 rpm.

EXAMPLE 2

Five polishing slurries were prepared according to the method of Example 1 to investigate the effect of the addition of a ferric nitrate catalyst, and/or a hydrogen peroxide oxidizing agent to a CMP slurry on tungsten rates. Each slurry included 5.0 wt % fumed silica. The concentrations of hydrogen peroxide and ferric nitrate in each slurry are indicated in Table 1.

TABLE 1

| Slurry | $H_2O_2$ wt % | Ferric Nitrate wt % | W CMP Rate Å/min |
|---|---|---|---|
| 1 | 0 | 0 | 43 |
| 2 | 0 | 0.2 | 291 |
| 3 | 5.0 | 0 | 385 |
| 4 | 5.0 | 0.02 | 4729 |
| 5 | 5.0 | 0.05 | 6214 |

As shown in Table 1, the control samples (slurries 1–3) polish tungsten at unacceptably low rates. In particular, neither hydrogen peroxide alone nor catalytic amounts of ferric nitrate alone achieve significant tungsten rates. Slurries 4 and 5, however, demonstrate that when an oxidizing agent and a catalyst are used in combination, there is a strong synergistic effect results in tungsten rates on the order of 5000 Å/min and greater. The addition of catalytic amounts of ferric nitrate to hydrogen peroxide (or conversely the addition of hydrogen peroxide to ferric nitrate) results in greater than one order of magnitude increase in tungsten rates.

EXAMPLE 3

Five polishing slurries were prepared and tested according to the methods set forth in Example 1 in order to investigate the effect of the addition of ferric nitrate catalyst and/or monopersulfate oxidizing agent to a CMP slurry on tungsten chemical mechanical polishing rates. The source of monopersulfate used in this Example is Oxone® manufactured by DuPont. Oxone® consists of the triple salt: $2KHSO_5 \cdot KHSO_4 \cdot K_2SO_4$, and is approximately 50% monopersulfate by weight. Each slurry included 5.0 wt % fumed silica. The concentrations of ferric nitrate and monopersulfate in the slurries are set forth in Table 2 below.

TABLE 2

| Slurry | Oxone ® wt % | Ferric Nitrate wt % | W CMP Rate Å/min |
|---|---|---|---|
| 1 | 0.0 | 0.0 | 43 |
| 2 | 0.0 | 0.2 | 291 |
| 3 | 10.0 | 0.0 | 264 |
| 4 | 20.0 | 0.0 | 413 |
| 5 | 10.0 | 0.2 | 3396 |

As shown in Table 2, the control samples, (slurries 1–4), polish tungsten at unacceptably low rates. Slurry 5, a combination of 5.0 wt. % monopersulfate and 0.2 wt. % ferric nitrate catalyst was able to polish a tungsten layer at a very high rate, once again demonstrating the synergistic effect of combining an electron shuffling catalyst with an oxidizing agent that has an electrochemical potential greater than the potential necessary to oxidize the catalyst.

EXAMPLE 4

Eight polishing slurries, each including varying amounts of hydrogen peroxide and ferric nitrate were prepared and tested according to the methods set forth in Example 1. Each slurry included 5.0 wt % fumed silica. The concentrations of ferric nitrate and hydrogen peroxide in the slurries are set forth in Table 3 below.

TABLE 3

| Slurry | $H_2O_2$ wt % | Ferric Nitrate wt % | W CMP Rate Å/min |
|---|---|---|---|
| 1 | 0.1 | 0.20 | 717 |
| 2 | 1.0 | 0.05 | 2694 |
| 3 | 2.0 | 0.02 | 3019 |
| 4 | 3.0 | 0.01 | 2601 |
| 5 | 3.0 | 0.02 | 3420 |
| 6 | 3.0 | 0.05 | 4781 |
| 7 | 5.0 | 0.01 | 3374 |
| 8 | 5.0 | 0.02 | 4729 |
| 9 | 5.0 | 0.05 | 6214 |

As shown in Table 3, tungsten polishing rates vary depending upon both the amount of hydrogen peroxide and the amount of ferric nitrate catalyst in the slurry. Furthermore, the results reported in Table 3 also demonstrate that only a very small amount of catalyst—0.05 weight percent or less—is very effective in catalyzing tungsten polishing using a CMP slurry comprising hydrogen peroxide.

EXAMPLE 5

Nine polishing slurries were prepared and tested according to the methods set forth in Example 1 in order to investigate the effect of varying the amount of ferric nitrate catalyst and/or monopersulfate (Oxone®) oxidizing agent in a CMP slurry on tungsten chemical mechanical polishing rates. Each slurry included 5.0 wt % fumed silica. The concentrations of ferric nitrate and monopersulfate in the slurries are set forth in Table 4 below.

TABLE 4

| Slurry | Oxone ® wt % | Ferric Nitrate wt % | W CMP Rate Å/min |
|---|---|---|---|
| 1 | 5.0 | 0.05 | 1925 |
| 2 | 5.0 | 0.14 | 2921 |
| 3 | 5.0 | 0.2 | 3178 |

TABLE 4-continued

| Slurry | Oxone ® wt % | Ferric Nitrate wt % | W CMP Rate Å/min |
|---|---|---|---|
| 4 | 5.0 | 0.35 | 3401 |
| 5 | 10.0 | 0.036 | 1661 |
| 6 | 10.0 | 0.2 | 3396 |
| 7 | 10.0 | 0.5 | 3555 |
| 8 | 15.0 | 0.05 | 2107 |
| 9 | 15.0 | 0.35 | 3825 |

The results of the tungsten CMP reported in Table 4 demonstrates that varying the amount of monopersulfate in the CMP slurry has a lesser effect on tungsten polishing rates than varying the amount of catalyst in the CMP slurry.

EXAMPLE 6

Eleven CMP slurries were prepared and tested according to the method set forth in Example 1 in order to investigate the effect of varying the catalyst type and oxidizing agent type on tungsten chemical mechanical polishing rates. Each slurry included 5.0 wt % fumed silica. The type and concentrations of catalyst and oxidizing agent used in each CMP slurry are set forth in Table 5 below.

TABLE 5

| Slurry | Oxidizer wt % | Catalyst wt % | W CMP Rate Å/min |
|---|---|---|---|
| 1 | 5.0% $H_2O_2$ | 28 ppm Cu | 1417 |
| 2 | 5.0% $H_2O_2$ | 70 ppm Cu, 7 ppm Fe | 2134 |
| 3 | 5.0% $H_2O_2$ | 28 ppm Ag | 561 |
| 4 | 5.0% $H_2O_2$ | 28 ppm Fe | 4729 |
| 5 | 5.0% Oxone ® | 560 ppm Cu | 1053 |
| 6 | 5% Oxone ® | 700 ppm Ag | 608 |
| 7 | 5.0% Oxone ® | 280 ppm Fe | 3178 |
| 8 | 5.0% $(NH_4)_2S_2O_8$ | 70 ppm Cu | 712 |
| 9 | 5.0% $(NH_4)_2Ce(NO_3)_6$ | 70 ppm Fe | 1501 |
| 10 | 5.0% K-Iodate | 70 ppm Fe | 1203 |
| 11 | 5.0% $H_2O_2$, 1.0% Oxone ® | 280 ppm Fe | 7840 |

Each slurry tested exhibited tungsten polishing rates superior to slurries including only an oxidizing agent (Example 2—slurry 3; Example 3—slurries 3 & 4) and superior to slurries including catalyst alone (Example 2—slurry 2; Example 3—slurry 2).

While the present invention has been described by means of specific embodiments, it will be understood that modifications may be made without departing from the spirit of the invention. The scope of the invention is not to be considered as limited by the description of the invention set forth in the specification and examples, but rather as defined by the following claims.

For example, although the examples above have described the preparation of CMP slurries with metal catalysts, it is to be understood that non-metal catalysts having multiple oxidation states may be incorporated into useful CMP compositions and slurries of this invention.

EXAMPLE 7

Two polishing slurries were prepared in order to evaluate their performance on patterned device wafers. Each wafer consisted of a W/TiN/Ti metallization deposited over a patterned PETEOS layer. The initial W layer thickness was 8000 Å, the TiN layer 400 Å, and the Ti layer 250 Å. Each wafer was polished until the W/TiN/Ti metallization was cleared from the entire wafer. The polishing conditions set forth in Example 1 were used. Slurries 1 and 2 contained 5.0 weight percent fumed silica. The type and concentrations of the catalyst and oxidizing agent used in each slurry are set forth in Table 6. A third commercially available slurry including 3 weight percent alumina abrasive and 5.0 weight percent ferric nitrate was also evaluated.

TABLE 6

| Slurry | Oxidizer (wt %) | Catalyst | Time to Clear |
|---|---|---|---|
| 1 | 5% $H_2O_2$ | 28 ppm Fe | 90 seconds |
| 2 | 5% $H_2O_2$ & 1% Oxone ® | 280 ppm Fe | 70 seconds |
| 3 | Commercial Slurry - 5 wt % Ferric Nitrate | | 170 seconds |

Excellent polishing performance was achieved using slurries 1 and 2. The slurries were observed to have high polishing rates on each of the metallization layers, resulting in a minimum time to clear the metallization. Both catalyst containing slurries exhibited superior performance in comparison to the commercially available slurry. Examination of the polished wafers with atomic force microscope demonstrated that the device wafers were successfully planarized, with acceptable low levels of erosion and dishing of stud, and line features. Furthermore, the underlying PETEOS layer was smooth with no evidence of scratches or pits.

EXAMPLE 8

This example demonstrates the enhancement of oxidizing agent longevity caused by adding various stabilizers to a chemical mechanical polishing slurry. Two chemical mechanical polishing slurries were evaluated. The first slurry consisted of 5.0 wt % silica, 0.02 wt % ferric nitrates.$(H_2O)_9$ catalyst, 5.0 wt % $H_2O_2$ oxidizing agent, the amount of stabilizer set forth in Table 7 below, and deionized water. The second slurry consisted of 5.0 wt % silica, 0.036 wt % ferric nitrates.$(H_2O)_9$ catalyst, 6 or 8 wt % $H_2O_2$ oxidizing agent, the amount of stabilizer set forth in Table 8 below, and deionized water. The silica used in both slurries is a fumed silica based dispersion manufactured by Cabot Corporation and sold under the trademark CAB-O-SPERSE®.

The slurries were prepared and applied to tungsten wafers according to the method of example 1. The slurries were then allowed to age for several days after which a known amount of the aged slurry was sampled and titrated with potassium permanganate to determine the amount of active peroxide remaining. The titration and polishing results are reported in Tables 7 and 8 below.

TABLE 7

| Stabilizer | % hydrogen peroxide remaining after 8 days | W Polishing rate (Å/min) | Silica Surface Area Area ($m^2/g$) |
|---|---|---|---|
| 1.1 equiv. phosphonic acid | 94 | 670 | 90 |
| 4.9 equiv. phosphoric acid | 93 | 1600 | 90 |
| 6.0 equiv. phthalic acid | 91 | 2200 | 90 |
| 3–5 equiv. citric acid | 72–89 | 2200 | 90 |
| 3–5 equiv. malonic acid | 79–85 | 2500 | 90 |

TABLE 7-continued

| Stabilizer | % hydrogen peroxide remaining after 8 days | W Polishing rate (Å/min) | Silica Surface Area Area ($m^2/g$) |
|---|---|---|---|
| None | 0 | 4300 | 90 |

TABLE 8

| Stabilizer | % hydrogen peroxide remaining after 6 days | W polishing rate (Å/min) | Silica Surface Area Area ($m^2/g$) |
|---|---|---|---|
| 1% adipic acid | 76% | 3451 | 150 |
| 0.5% adipic acid 1 equiv oxalic acid e | 84% | 4054 | 150 |
| 5 equiv malonic acid | 83% | 3802 | 90 |

The results indicate that the hydrogen peroxide activity was maintained in each slurry that included a stabilizer in comparison to the slurry containing no stabilizer which had no hydrogen peroxide activity after 8 days. The polishing results are acceptable and demonstrate that stabilizers effect the catalyst efficiency of the slurry. Therefore, there is a balance between a chemically stable slurry and the high tungsten rates that are promoted by the catalyst/oxidizing agent combinations.

EXAMPLE 9

Tungsten wafers were polished according to the method of Example 1 using a slurry including an alumina abrasive. The alumina dispersion used in each slurry was W-A355 manufactured by Cabot Corporation. The slurry compositions tested and their polishing results are set forth in Table 9, below.

TABLE 9

| Slurry | $H_2O_2$ (wt %) | Alumina (wt %) | ferric nitrate .$(H_2O)_9$ | Stabilizer (wt %) | W Rate (Å/min) |
|---|---|---|---|---|---|
| 1 | 5.0% | 3.0% | 0.02% | None | 566 |
| 2 | 5.0% | 3.0% | 0.02% | 1% citric acid | 1047 |
| 3 | 6.0% | 3.0% | 0.036% | 0.091% Potassium Hydrogen Phthalate | 1947 |
| 4 | 6.0% | 3.0% | 0.036% | 0.1066% Tetrafluoro phthalate | 2431 |
| 5 | 6.0% | 3.0% | 0.036% | 0.0466% g Malonic Acid | 2236 |

As illustrated from slurries 2–5 of Table 9, alumina, when combined with an oxidizing agent, a catalyst stabilizer complex is effective in polishing a tungsten substrate.

While the present invention has been described by means of specific embodiments, it will be understood that modifications may be made without departing from the spirit of the invention. The scope of the invention is not to be considered as limited by the description of invention set forth in the specification and examples, but rather as defined by the following claims.

What we claim is:

1. A chemical mechanical polishing composition comprising the admixture of:

a first component including at least one oxidizing agent; and a second component that includes the product of the mixture of at least one catalyst having multiple oxidation states and at least one stabilizer.

2. The chemical mechanical polishing composition of claim 1 wherein the stabilizer is an organic acid, an inorganic acid, a nitrile, or mixtures thereof.

3. The chemical mechanical polishing composition of claim 1 wherein the stabilizer is an organic acid.

4. The chemical mechanical polishing composition of claim 2 wherein the stabilizer is selected from the group phosphoric acid, phthalic acid, citric acid, malonic acid, phosphonic acid, oxalic acid, adipic acid, benzonitrile, or mixtures thereof.

5. The chemical mechanical polishing composition of claim 4 wherein the stabilizer is the admixture of from about 0 equivalents per catalyst to about 3 equivalents per catalyst of oxalic acid, and from about 0.2 to about 1.0 weight percent adipic acid.

6. The chemical mechanical polishing composition of claim 4 wherein the stabilizer is from about 2 equivalents per catalyst to about 15 equivalents per catalyst of malonic acid.

7. The chemical mechanical polishing composition of claim 4 wherein the stabilizer is from about 3 equivalents per catalyst to about 3.0 weight percent phthalic acid.

8. The chemical mechanical composition of claim 1 wherein the oxidizing agent is an organic peroxide compound, an inorganic peroxide compound, or mixtures thereof.

9. The chemical mechanical composition of claim 1 wherein the oxidizing agent is from about 0.5 to about 10.0 weight percent hydrogen peroxide.

10. The chemical mechanical composition of claim 1 including at least one abrasive to produce a chemical mechanical polishing slurry.

11. The chemical mechanical polishing slurry of claim 10 wherein the abrasive is at least one metal oxide abrasive selected from the group including alumina, ceria, germania, silica, titania, zirconia, or mixtures thereof.

12. The chemical mechanical polishing slurry of claim 11 wherein the metal oxide abrasive is from about 1.0 to about 20.0 weight percent alumina.

13. The chemical mechanical composition of claim 1 wherein the catalyst is an iron catalyst selected from the group consisting of inorganic iron compounds and organic iron compounds having multiple oxidation states.

14. The chemical mechanical polishing composition of claim 13 wherein the iron catalyst is from about 0.01 to about 0.5 weight percent ferric nitrate.

15. A chemical mechanical polishing slurry comprising: from about 3.0 to about 7.0 weight percent silica; from about 0.5 to about 10.0 weight percent hydrogen peroxide; and the product of the mixture of from about 0.01 to about 0.05 weight percent ferric nitrate catalyst and from about 2 equivalents per catalyst to about 15 equivalents per catalyst of malonic acid.

16. The chemical mechanical polishing slurry of claim 15 wherein the silica has a surface area of from about 120 $m^2/g$ to about 200 $m^2/g$.

17. A method for polishing a substrate including at least one metal layer comprising the steps of:
(a) preparing an admixture of a first component including at least one oxidizing agent, and a second component including the product of the mixture of at least one catalyst having multiple oxidation states and at least one stabilizer, and deionized water to produce a chemical mechanical polishing composition;
(b) applying the chemical mechanical polishing composition to the substrate; and
(c) removing at least a portion of the metal layer from the substrate by bringing a pad into contact with the substrate and moving the pad in relation to the substrate.

18. The method of claim 17 wherein the substrate includes a tungsten containing metal layer and a titanium nitride containing metal layer and wherein at least a portion of the tungsten layer and a portion of the titanium nitride layer is removed in step (c).

19. The method of claim 17 wherein the stabilizer is an organic acid, an inorganic acid, a nitrile, or mixtures thereof.

20. The method of claim 19 wherein the stabilizer is an organic acid selected from the group phosphoric acid, phthalic acid, citric acid, malonic acid, phosphinic acid, oxalic acid, adipic acid, benzonitrile, or mixtures thereof.

21. The method of claim 20 wherein the stabilizer is selected from a mixture of from about 0 equivalents per catalyst to about 3 equivalents per catalyst of oxalic acid and from about 0.2 to about 1.0 weight percent adipic acid, from about 2 equivalents per catalyst to about 15 equivalents per catalyst of malonic acid, and from about 3 equivalents per catalyst to about 3.0 weight percent phthalic acid.

22. The method of claim 21 wherein the oxidizing agent is from about 0.5 to about 10.0 weight percent hydrogen peroxide, and the catalyst is from about 0.01 to about 0.5 weight percent ferric nitrate.

23. The method of claim 17 wherein the polishing composition further comprises at least one metal oxide abrasive.

24. The method of claim 23 wherein the metal oxide abrasive is alumina.

25. The method of claim 23 wherein the metal oxide abrasive is silica.

26. The method of claim 25 wherein the silica has a surface area of from about 120 $m_2/g$ to about 200 $m_2/g$.

* * * * *

UNITED STATES PATENT AND TRADEMARK OFFICE
CERTIFICATE OF CORRECTION

PATENT NO. : 5,980,775
DATED : November 9, 1999
INVENTOR(S) : Grumbine, et al.

It is certified that error appears in the above-identified patent and that said Letters Patent is hereby corrected as shown below:

At column 16, line 50, delete "120 m$_2$/g" and replace with -- 120 m$^2$/g --".

At column 16, line 50, delete "200 m$_2$/g" and replace with -- 200 m$^2$/g --".

Signed and Sealed this

Fourth Day of July, 2000

*Attest:*

Q. TODD DICKINSON

*Attesting Officer*      *Director of Patents and Trademarks*